United States Patent
Yonezawa et al.

(10) Patent No.: US 8,012,787 B2
(45) Date of Patent: Sep. 6, 2011

(54) PHOTOVOLTAIC DEVICE AND MANUFACTURING METHOD THEREOF

(75) Inventors: Masato Yonezawa, Tokyo (JP); Kimikazu Hazumi, Tokyo (JP); Akihiro Takami, Tokyo (JP); Hiroaki Morikawa, Tokyo (JP); Kunihiko Nishimura, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 12/989,098

(22) PCT Filed: Apr. 30, 2008

(86) PCT No.: PCT/JP2008/058277
§ 371 (c)(1),
(2), (4) Date: Oct. 22, 2010

(87) PCT Pub. No.: WO2009/133607
PCT Pub. Date: Nov. 5, 2009

(65) Prior Publication Data
US 2011/0053310 A1    Mar. 3, 2011

(51) Int. Cl.
*H01L 21/00* (2006.01)
(52) U.S. Cl. .............. 438/57; 438/71; 438/73; 257/414; 257/436; 257/E31.124
(58) Field of Classification Search .................. 438/71
See application file for complete search history.

(56) References Cited

U.S. PATENT DOCUMENTS

| 4,322,571 | A | * | 3/1982 | Stanbery ............... 136/255 |
| 6,127,623 | A | | 10/2000 | Nakamura et al. |
| 6,147,297 | A | | 11/2000 | Wettling et al. |
| 2002/0084503 | A1 | | 7/2002 | Lee et al. |

(Continued)

FOREIGN PATENT DOCUMENTS

JP    9-283779 A    10/1997

(Continued)

OTHER PUBLICATIONS

International Search Report (PCT/ISA/210) issued on Jun. 10, 2008, by Japanese Patent Office as the International Searching Authority for International Application No. PCT/JP2008/058277.

*Primary Examiner* — Ha Tran T Nguyen
*Assistant Examiner* — Shaka Scarlett
(74) *Attorney, Agent, or Firm* — Buchanan Ingersoll & Rooney PC (57) ABSTRACT

The manufacturing method includes: forming a P-type silicon substrate and a high-concentration N-type diffusion layer, in which an N-type impurity is diffused in a first concentration, on an entire surface at a light-incident surface side; forming an etching resistance film on the high-concentration N-type diffusion layer and forming fine pores at a predetermined position within a recess forming regions on the etching resistance film; forming recesses by etching the silicon substrate around a forming position of the fine pores, so as not to leave the high-concentration N-type diffusion layer within the recess forming region; forming the low-concentration N-type diffusion layer, in which an N-type impurity is diffused in a second concentration that is lower than the first concentration, on a surface on which the recesses are formed; and forming a grid electrode in an electrode forming region at a light-incident surface side of the silicon substrate.

8 Claims, 7 Drawing Sheets

U.S. PATENT DOCUMENTS

2011/0036402 A1 * 2/2011 Ishihara et al. ............... 136/256

FOREIGN PATENT DOCUMENTS

| | | |
|---|---|---|
| JP | 10-070296 A | 3/1998 |
| JP | 11-508088 A | 7/1999 |
| JP | 2000-022185 A | 1/2000 |
| JP | 2002-217430 A | 8/2002 |
| JP | 2003-197932 A | 7/2003 |
| JP | 2003-309276 A | 10/2003 |
| JP | 2004-047776 A | 2/2004 |
| JP | 2006-073832 A | 3/2006 |

* cited by examiner

PHOTOVOLTAIC DEVICE AND MANUFACTURING METHOD THEREOF

TECHNICAL FIELD

The present invention relates to a photovoltaic device and its manufacturing method.

BACKGROUND ART

To improve a performance of a photovoltaic device such as a solar cell, it is important that how efficiently solar light can be taken into the photovoltaic device. Therefore, conventionally, a texture structure intentionally having fine asperities of a size from a few dozens nanometers to a few dozens micrometers formed on a surface of a light incident side has been manufactured. According to this conventional texture structure, light once reflected from the surface is input to the surface again to take more solar light into the photovoltaic device, thereby increasing generated currents and improving the photoelectric conversion efficiency.

As a method of forming a texture structure on a solar cell substrate, when the substrate is a monocrystalline silicon (Si) substrate, there has been widely used an anisotropic etching process that utilizes a crystal orientation of an alkali aqueous solution, such as sodium hydroxide and potassium hydroxide, the etching rate of which has a crystal orientation dependency (see, for example, Patent Document 1). For example, when the anisotropic etching process is performed on a substrate surface having a (100) surface orientation on the surface, a texture of a pyramid shape having a (111) surface exposed is formed.

However, in the case of a polycrystalline silicon substrate, according to a method of performing an anisotropic etching process by using an alkali aqueous solution, crystal surface orientations of crystal particles constituting a substrate surface are not aligned. Further, etching rates of an anisotropic etching process itself using an alkali aqueous solution are greatly different depending on a crystal surface. Therefore, a texture structure can be manufactured only partially. Under these circumstances, in the case of the polycrystalline silicon substrate, there is a limit to a reduction of a reflection rate. For example, the reflection rate at the wavelength of 628 nanometers is about 36% in the case of silicon of which surface is mirror polished, and the reflection rate is about 15% in the case of a monocrystalline silicon substrate of a (100) surface which is wet etched. On the other hand, the reflection rate is about 27% to 30% when a polycrystalline silicon substrate is wet etched.

As a method of forming a texture structure on the entire surface regardless of its crystal surface orientation, a mixed acid etching method using an etching mask has been proposed (see, for example, Patent Document 2). As for a manufacturing method of an etching mask, there can be used a method according to lithography, which is used in a semiconductor process, or a method of mixing fine particles of low etching resistance into a liquid solution of an etching resistance material and coating the mixture onto a substrate surface.

In this way, for example, a low-concentration N-type diffusion layer, in which an N-type impurity is diffused in a low-concentration, is formed on the entire surface of a P-type silicon substrate at a formation side of a texture structure, while a high-concentration N-type diffusion layer, in which an N-type impurity is diffused in a high-concentration, is formed at a light-incident-side electrode formation portion. Further, a grid electrode made of a metal such as silver and arranged in a comb shape, and a bus electrode made of a metal such as silver that collects currents from the grid electrode are formed at the light-incident-side electrode formation portion. A back-surface electrode made of a metal such as aluminum and silver is then formed on a back surface of a silicon substrate. With this arrangement, a photovoltaic device can be obtained.

Patent Document 1: Japanese Patent Application Laid-open No. H10-70296
Patent Document 2: Japanese Patent Application Laid-open No. 2003-309276

DISCLOSURE OF INVENTION

Problem to be Solved by the Invention

In a manufacturing method of a photovoltaic device, by performing high-concentration diffusion of an impurity at only a portion joined to a light-incident-side electrode such as a grid electrode and a bus electrode, a satisfactory resistance junction with the light-incident-side electrode can be obtained. However, to perform high-concentration diffusion in a diffusion layer at only a portion joined to a light-incident-side electrode, a high-concentration-diffusion exclusive patterning needs to be performed. In this case, the number of manufacturing processes increases and the manufacturing cost also increases. Therefore, it has been required to obtain a satisfactory resistance junction with a light-incident-side electrode by performing high-concentration diffusion at only a portion joined to the light-incident-side electrode in a simple process without adding many manufacturing processes.

The present invention has been achieved in view of the above circumstances, and an object of the present invention is to provide a manufacturing method of a photovoltaic device capable of forming a high-concentration diffusion layer at a portion of the photovoltaic device joined to the light-incident-side electrode in a simple process without adding many manufacturing processes. Another object of the present invention is to provide a photovoltaic device capable of obtaining a satisfactory resistance junction with a light-incident-side electrode.

Means for Solving Problem

A manufacturing method of a photovoltaic device according to an aspect of the present invention includes: a first diffusion-layer forming step of forming a first diffusion layer of a first concentration by diffusing a second conductivity-type impurity on an entire surface at a light-incident surface side of a first conductivity-type semiconductor substrate; an etching-resistance-film forming step of forming an etching resistance film that has an etching resistance characteristic on the first diffusion layer; a fine-pore forming step of forming fine pores at a predetermined position in a recess forming region on the etching resistance film to expose the first diffusion layer; a recess forming step of forming recesses by etching the first diffusion layer and the semiconductor substrate around an exposed position of the first diffusion layer, so as not to leave the first diffusion layer within the recess forming region; a second diffusion-layer forming step of forming a second diffusion layer by diffusing a second conductivity-type impurity in a second concentration, which is lower than the first concentration, on a surface on which the recesses are formed; and a surface-electrode forming step of forming a surface electrode in an electrode forming region other than the recess forming region at the light-incident surface side of the semiconductor substrate.

Effect of the Invention

According to the present invention, a first diffusion layer of a first concentration is formed on a substrate surface first, and an etching resistance film is then formed. Fine openings to form a texture structure are formed in a region other than an electrode forming region. Recesses are formed around the openings by mixed acid etching. Thereafter, a second diffusion layer of a second concentration, which is lower than the first concentration, is formed on the substrate surface on which the recesses are formed. Therefore, by adding only one process of forming the second diffusion layer to a process of forming the texture structure, the second diffusion layer of a low concentration can be formed on the texture structure, and the first diffusion layer of a high concentration can be formed in other regions. As a result, a photovoltaic device can be obtained in a simple process at low cost.

BRIEF DESCRIPTION OF DRAWINGS

FIG. 1-1 depicts a top surface view of a photovoltaic device.

FIG. 1-2 depicts a back surface view of the photovoltaic device.

FIG. 1-3 depicts a cross-sectional view along A-A in FIG. 1-2.

FIG. 3-1 depicts a schematic cross-sectional view of an exemplar procedure of a manufacturing method of a photovoltaic device according to a first embodiment (part 1).

FIG. 3-2 depicts a schematic cross-sectional view of an exemplar procedure of the manufacturing method of a photovoltaic device according to the first embodiment (part 2).

FIG. 3-3 depicts a schematic cross-sectional view of an exemplar procedure of the manufacturing method of a photovoltaic device according to the first embodiment (part 3).

FIG. 3-4 depicts a schematic cross-sectional view of an exemplar procedure of the manufacturing method of a photovoltaic device according to the first embodiment (part 4).

FIG. 3-5 depicts a schematic cross-sectional view of an exemplar procedure of the manufacturing method of a photovoltaic device according to the first embodiment (part 5).

FIG. 3-6 depicts a schematic cross-sectional view of an exemplar procedure of the manufacturing method of a photovoltaic device according to the first embodiment (part 6).

FIG. 3-7 depicts a schematic cross-sectional view of an exemplar procedure of the manufacturing method of a photovoltaic device according to the first embodiment (part 7).

FIG. 3-8 depicts a schematic cross-sectional view of an exemplar procedure of the manufacturing method of a photovoltaic device according to the first embodiment (part 8).

FIG. 3-9 depicts a schematic cross-sectional view of an exemplar procedure of the manufacturing method of a photovoltaic device according to the first embodiment (part 9).

EXPLANATIONS OF LETTERS OR NUMERALS

100 Photovoltaic device
101 Silicon substrate
102L Low-concentration N-type diffusion layer
102H High-concentration N-type diffusion layer
103 Etching resistance film
104 Fine pore
105a Recess forming region
105b Electrode forming region
106 Recess
109 Reflection prevention film
110 P+ layer
111 Grid electrode
112 Junction portion
113 Bus electrode
121 Backside electrode
122 Backside collecting electrode
200A, 200B Laser processing apparatus
201 Stage
203 Laser oscillator
204 Laser beam
205 Reflection mirror
206 Beam splitter
207 Aperture
208 Optical reduction system
211, 213 Galvanomirror
212 X-axis direction
214 Y-axis direction

BEST MODE(S) FOR CARRYING OUT THE INVENTION

Exemplary embodiments of a photovoltaic device and its manufacturing method according to the present invention will be explained below in detail with reference to the accompanying drawings. The present invention is not limited to the embodiments. In addition, cross-sectional views of the photovoltaic device explained in the following embodiments are only schematic, and the relationship between thickness and width, the ratio of thickness of each layer or the like shown in the drawings are different from actual products.

First Embodiment

Figure 11:
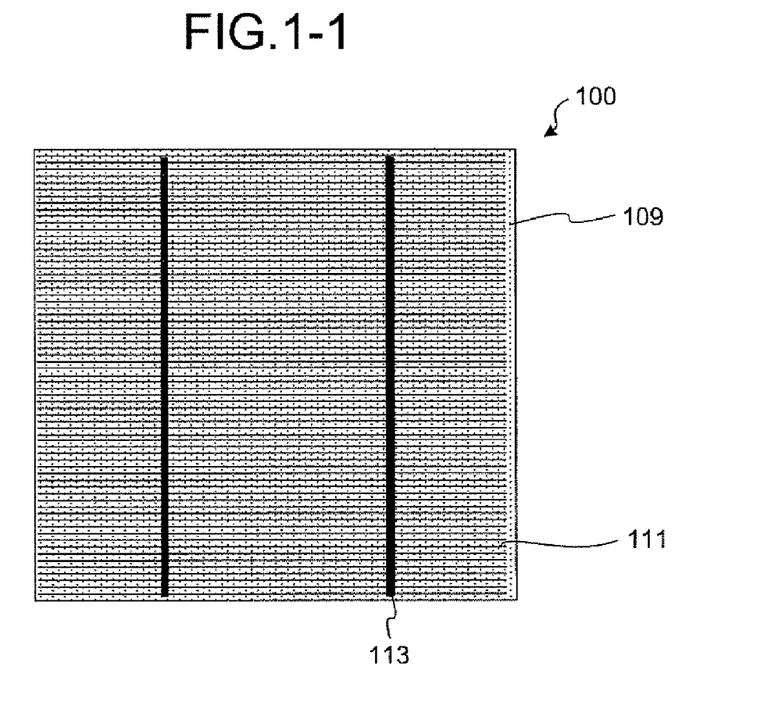
Figure 12:
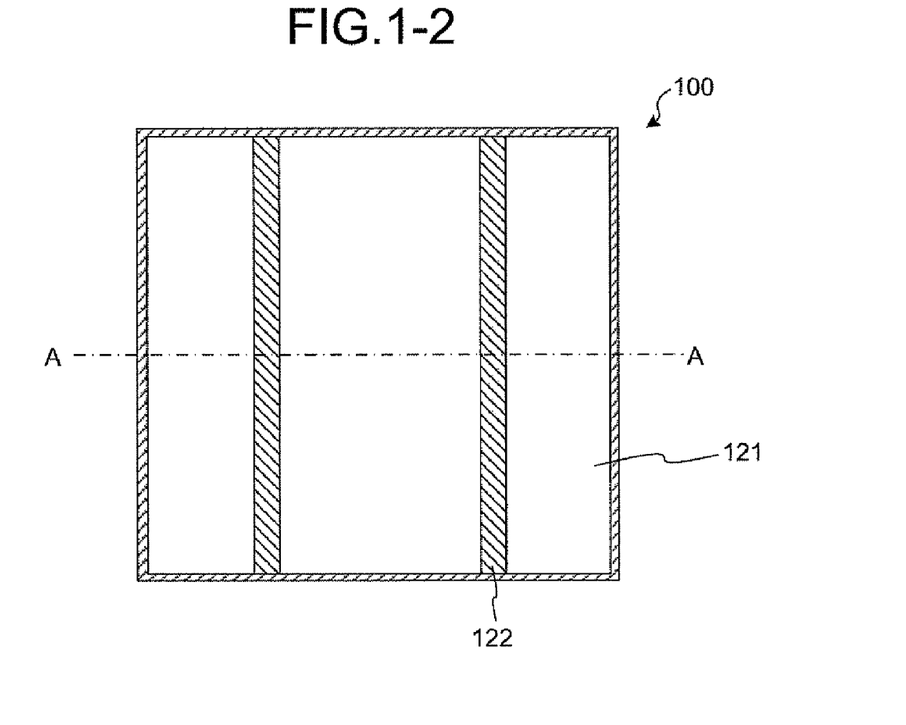
Figure 13:
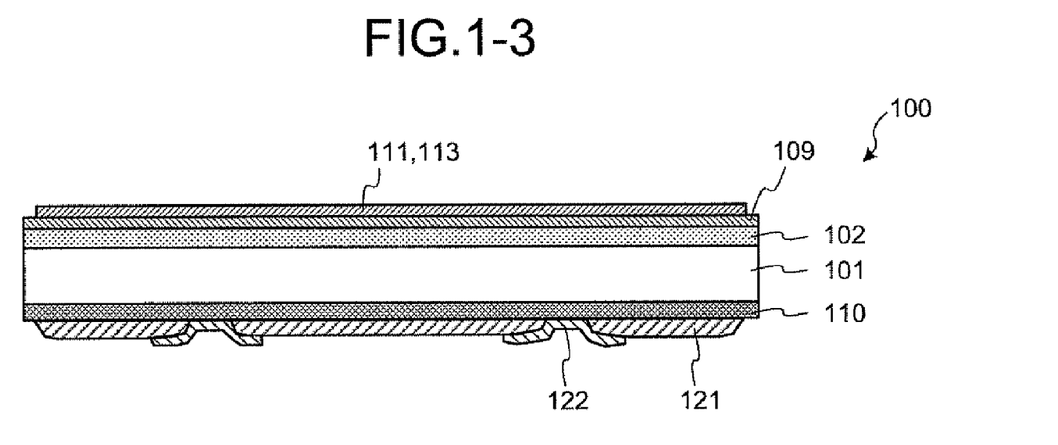

First, before explaining a configuration of a photovoltaic device according to a first embodiment of the present invention, an outline of the entire configuration of a general photovoltaic device is explained. FIGS. 1-1 to 1-3 schematically depict an example of the entire configuration of a general photovoltaic device, where FIG. 1-1 depicts a top surface view of the photovoltaic device, FIG. 1-2 depicts a back surface view of the photovoltaic device, and FIG. 1-3 depicts a cross-sectional view along A-A in FIG. 1-2. A photovoltaic device 100 includes a photoelectric conversion layer that includes: a P-type silicon substrate 101 as a semiconductor substrate; an N-type diffusion layer 102, in which an N-type impurity is diffused, formed on a surface at one principal surface (a light receiving surface) side of the P-type silicon substrate 101; and a P+ layer 110 that contains a P-type impurity in a higher concentration than that of the silicon substrate 101, which is formed on a surface at the other principal surface (a back surface) side. The photovoltaic device 100 further includes: a reflection prevention film 109 that prevents reflection of incident light on the light receiving surface of the photoelectric conversion layer; a grid electrode 111 made of silver or the like and provided on the light receiving surface to locally collect electricity generated in the photoelectric conversion layer; a bus electrode 113 made of silver or the like and provided substantially orthogonally to the grid electrode 111 to extract electricity collected by the grid electrode 111; a backside electrode 121 made of aluminum or the like provided on substantially the entire surface of a back surface of the P-type silicon substrate 101 in order to extract electricity generated in the photoelectric conversion layer and also to reflect incident light; and a backside collecting electrode 122 made of silver or the like that collects electricity generated in the backside electrode 121.

Figure 2:
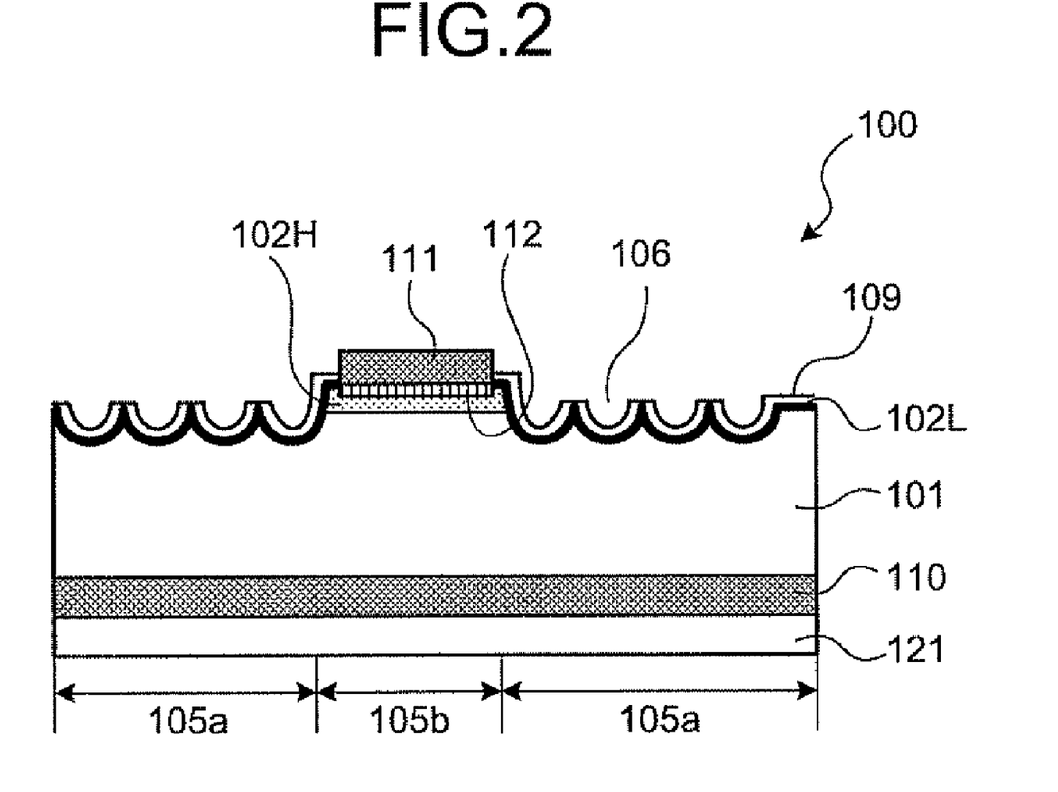
FIG. 2 depicts a partially enlarged cross-sectional view of a periphery of a grid electrode of the photovoltaic device shown in FIGS. 1-1 to 1-3.

Features of the first embodiment are explained next. FIG. 2 depicts a partially enlarged cross-sectional view of a periphery of the grid electrode of the photovoltaic device shown in FIGS. 1-1 to 1-3. FIG. 2 depicts a cutout state of a periphery of the grid electrode 111 in FIGS. 1-1 to 1-3.

As shown in FIG. 2, a light-receiving surface side of the photovoltaic device 100 has recess forming regions 105a formed with a texture structure made of plural recesses 106, each of which is formed with a surface having a curvature, and an electrode forming region 105b formed with a light-incident-side electrode such as the grid electrode 111 of the photovoltaic device 100.

Each of the recess forming regions 105a is formed with a texture structure with plural recesses 106 formed at a predetermined interval on a top surface of the silicon substrate 101. A low-concentration N-type diffusion layer 102L, in which an N-type impurity is diffused in a low concentration, is formed at a predetermined depth from the top surface of the silicon substrate 101 containing a surface on which the recesses 106 are formed. Top surface portions of the silicon substrate 101 present between the recesses 106 are recessed from a height of the top surface of the silicon substrate 101 (a top surface of the electrode forming region 105b). While FIG. 2 is a cross-sectional view, a cross section of the recesses 106 in a direction parallel with the substrate surface has substantially a circular shape. That is, each recess 106 has a bowl shape. In the electrode forming region 105b, a light-incident-side electrode such as the grid electrode 111 is formed via a junction portion 112 on a high-concentration N-type diffusion layer 102H, in which an N-type impurity is diffused in a high concentration in order to have a lower resistance than that of the low-concentration N-type diffusion layer 102L. Structures of the light receiving surface and the back surface of the silicon substrate 101 are similar to those explained with reference to FIGS. 1-1 to 1-3, and therefore explanations thereof will be omitted.

A manufacturing method of the photovoltaic device 100 in this structure is explained next. FIGS. 3-1 to 3-9 are schematic cross-sectional views of an example of a process procedure of the manufacturing method of the photovoltaic device according to the first embodiment. Sizes mentioned below are only examples.

Figure 31:
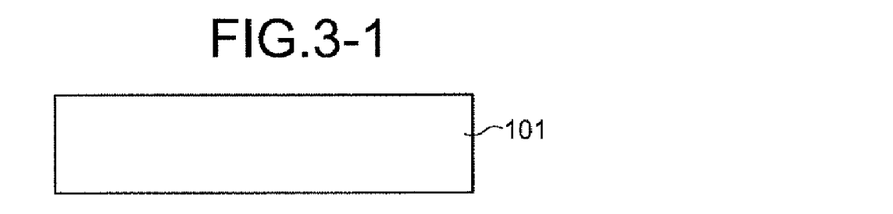

First, the silicon substrate 101 is prepared (FIG. 3-1). It is assumed that a P-type polycrystalline silicon substrate used most for household photovoltaic devices is used. The silicon substrate 101 is manufactured by slicing a polycrystalline silicon ingot with a multi-wire saw and by removing a damage caused at a slicing time, with wet etching using an acid or alkali solution. The thickness of the silicon substrate 101 after removing the damage is 250 micrometers, and the dimensions are 150 nm×150 mm.

Figure 32:
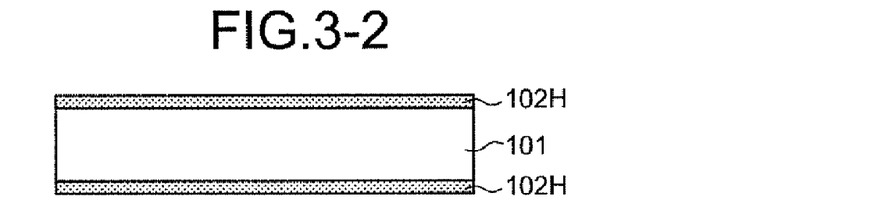

Next, the silicon substrate 101, from which the damage is removed, is input to a thermal oxidation furnace, and is heated in an atmosphere of phosphorus (P) as an N-type impurity. Phosphorus is diffused in a high concentration on the surface of the silicon substrate 101, thereby forming the high-concentration N-type diffusion layer 102H (FIG. 3-2). Phosphorus oxychloride ($POCl_3$) is used and is diffused at 840° C. to form the phosphorus atmosphere. As a result, the high-concentration N-type diffusion layer 102H is formed on the top surface, a lower surface, and a side surface of the silicon substrate 101. The high-concentration N-type diffusion layer 102H on the side surface is removed by etching and the like.

Figure 33:
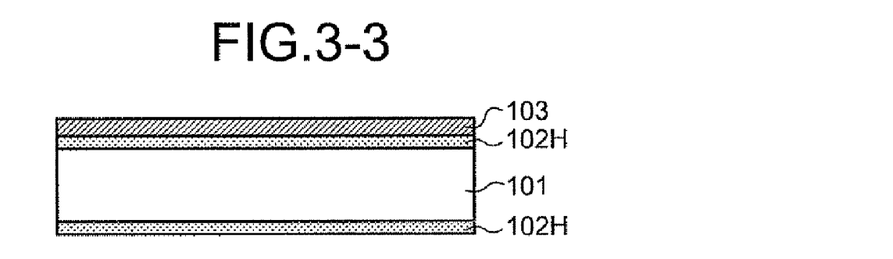

Thereafter, a film having an etching resistance (hereinafter, "etching resistance film") 103 is formed on the high-concentration N-type diffusion layer 102H formed on one principal surface (FIG. 3-3). For the etching resistance film 103, there can be used a silicon nitride film (hereinafter, "SiN film"), a silicon oxide ($SiO_2$, SiO) film, an oxynitride silicon (SiON) film, an amorphous silicon (a-Si) film, a diamond-like carbon film, and a resin film. In this case, an SiN film having a film thickness of 240 nanometers formed by a plasma CVD (Chemical Vapor Deposition) method is used for the etching resistance film 103. Although the film thickness is set at 240 nanometers, a proper film thickness can be selected based on an etching condition at a texture etching time and the removability of an SiN film at a latter stage.

Figure 34:
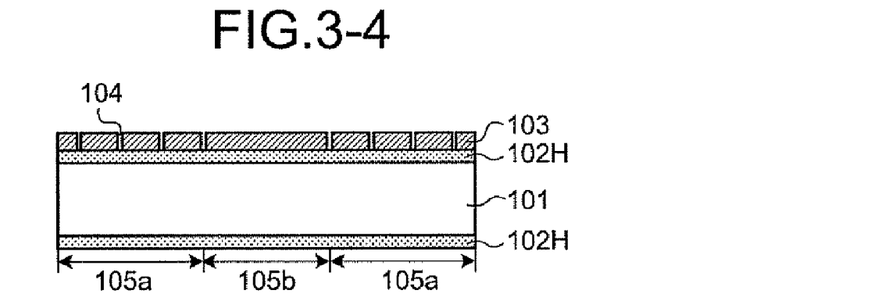

Fine pores 104 are then formed in the recess forming regions 105a on the etching resistance film 103 (FIG. 3-4). The fine pores 104 are not formed in the electrode forming region 105b, in which a light-incident-side electrode of the photovoltaic device 100 is to be formed without forming a texture structure. The fine pores 104 can be formed by using a method according to lithography used in a semiconductor process or a method according to a laser irradiation. The method according to a laser irradiation does not require any complex process that includes resist coating, exposure and development, etching, resist removal, which are necessary when the fine pores are to be formed by a photolithography technique. The method according to a laser irradiation has an advantage in that the fine pores 104 can be formed by only irradiating a laser beam and that the process can be simplified. When the fine pores 104 are formed by a laser irradiation, the wavelength of a laser beam is preferably equal to or smaller than 700 nanometers. This is for the following reasons. That is, when the wavelength of a laser beam is larger than 700 nanometers, not only the laser beam forms the fine pores 104 within the etching resistance film 103 but also the laser beam enters deep into the high-concentration N-type diffusion layer 102H and the silicon substrate 101. In some cases, a damage to the silicon substrate 101 becomes deep. This eventually has a risk that, at a time of forming the recesses 106 by an etching described later, the damage generated by the laser beam can remain without being removed even after the recesses 106 are formed on the silicon substrate 101. Therefore, to form the recesses 106 without leaving a damage on the silicon substrate 101, it is preferable that a laser beam having a wavelength equal to or smaller than 700 nanometers is used.

Figure 4:
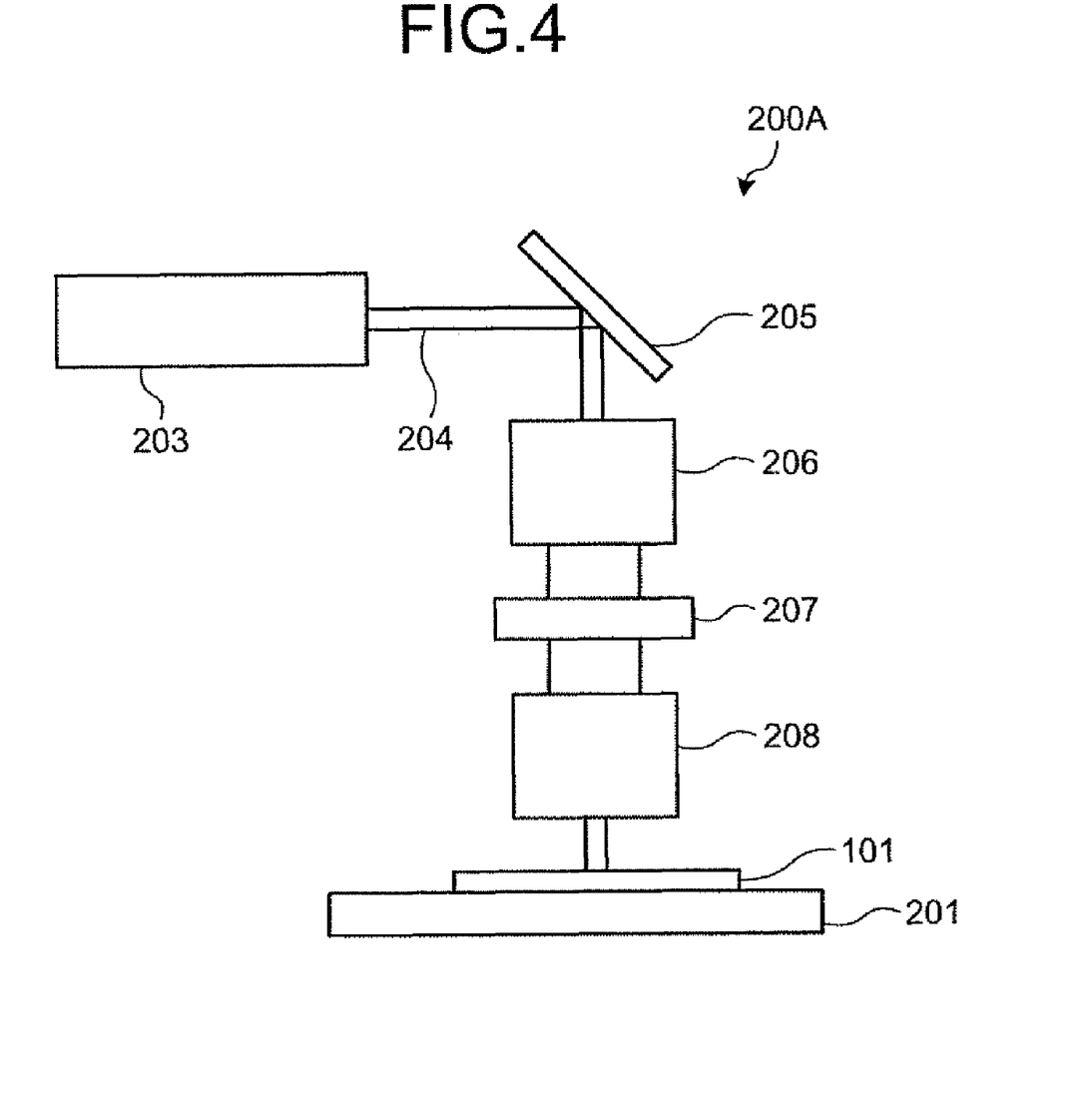
FIG. 4 depicts a schematic diagram of an exemplar configuration of a laser processing apparatus that forms openings.

FIG. 4 depicts a schematic diagram of an exemplar configuration of a laser processing apparatus for forming openings. A laser processing apparatus 200A includes a stage 201 on which a processing target object such as the silicon substrate 101 is mounted, a laser oscillator 203 that outputs a laser beam 204, a reflection mirror 205 that guides the laser beam 204 in an optical path by reflecting the laser beam 204, a beam splitter 206 that splits the laser beam 204 into plural laser beams, an aperture 207 that forms a beam shape in a predetermined shape, and an optical reduction system 208 that reduces the laser beam 204 passed through the aperture 207 and irradiates the reduced laser beam to the processing target object.

In the laser processing apparatus 200A having the above arrangement, the laser beam 204 output from the laser oscillator 203 is enlarged by the beam splitter 206 after an optical path is changed by the reflection mirror 205, and is input to the aperture 207. After passing through the aperture 207, the laser beam 204 is irradiated to a predetermined position on the etching resistance film 103 by the optical reduction system 208. As a result, the fine pores 104 as plural fine pores are formed in the etching resistance film 103 formed on the silicon substrate 101, and a surface of the silicon substrate 101 as a base is exposed. When the wavelength of a laser beam is set equal to or smaller than 400 nanometers in the case of using an SiN film for the etching resistance film 103, desired fine pores 104 can be easily manufactured. This is because when the wavelength of a laser beam is larger than 400 nanometers, absorption of the laser beam into the SiN film becomes insufficient, and a shape of openings, that is, the fine pores 104, cannot be sufficiently controlled. When the wavelength of a laser beam is equal to or smaller than 400 nanometers, the laser beam is sufficiently absorbed into the SiN film. Consequently, formation of the fine pores 104 can be easily controlled and the fine pores 104 in a desired shape can be obtained.

A combination of Nd:YAG (Yttrium Aluminum Garnet) laser and a triple harmonic generator is used as the laser oscillator 203. With this arrangement, the wavelength of a laser beam becomes 355 nanometers which can be absorbed by the SiN film. A focal depth of the optical system is set at or higher than 10 micrometers. The ratio of a recess depth to a recess diameter can be set large and light confinement effect can be set large, by selecting the intensity of a laser beam capable of forming recesses on the silicon substrate 101 as the base after removing the SiN film. It has become clear by an experiment that openings can be formed on the SiN film at or above 0.4 J/cm$^2$, and recesses can be formed on the silicon substrate 101 as the base at or above 2 J/cm$^2$. Therefore, a laser beam intensity of 3 J/cm$^2$ is used here. Although a triple harmonic wave of the Nd:YAG laser is used for a laser beam source, other laser beam source can be also used when the laser beam source can output a laser beam of a wavelength shorter than 700 nanometers at which a damage to the silicon substrate 101 due to a laser beam can be suppressed within 4 micrometers which is within a texture etching depth.

A metal sheet formed with openings is used for the aperture 207 in the laser processing apparatus 200A described above. Because the laser beam 204 passed through the aperture 207 is reduced and irradiated to a processing target object, an opening pattern of the aperture 207 can be relatively large. Therefore, a metal sheet formed with openings by using wet etching or sandblasting can be also used for the aperture 207. A glass mask having a thin-film metal pattern of a chrome film or the like formed on a glass sheet can be also used for the aperture 207. In this case, attention should be paid to the transmission rate of glass and the resistance of a metal thin film. When forming the fine pores 104 in the etching resistance film 103 of the recess forming regions 105$a$, the fine pores 104 can be provided on a triangular lattice point or a square lattice point.

Figure 35:
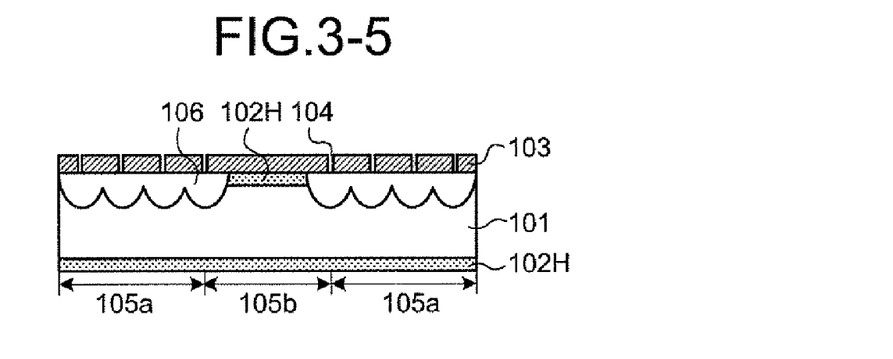

Next, the recesses 106 are formed by etching a portion near the surface of the silicon substrate 101 containing the high-concentration N-type diffusion layer 102H through the fine pores 104 opened in the etching resistance film 103 (FIG. 3-5). Because the silicon substrate 101 is etched through the fine pores 104, the recesses 106 are formed at a concentric zone around each fine pore 104 on the surface of the silicon substrate 101. When etching is performed by using an etching liquid of a mixed acid system, a uniform texture is formed without being influenced by a crystal surface orientation of the surface of the silicon substrate 101. Thus, the photovoltaic device 100 with little surface-reflection loss can be manufactured. In this case, a mixed liquid of hydrofluoric acid and nitric acid is used for the etching liquid. The mixing ratio of hydrofluoric acid, nitric acid, and water is 1:20:10. The mixing ratio of the etching liquid can be changed to a proper mixing ratio based on a desired etching rate and a desired etching shape. In this case, the etching is performed to remove the high-concentration N-type diffusion layer 102H in the recess forming regions 105$a$.

Figure 36:
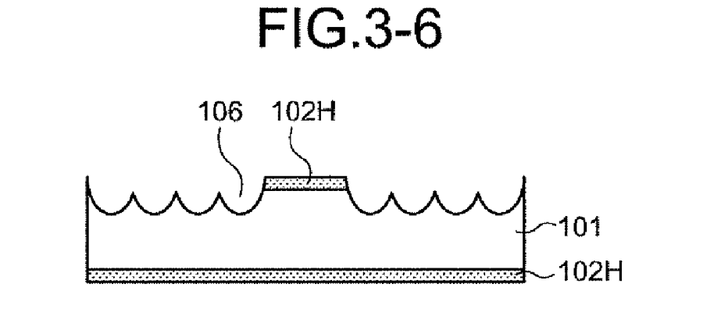
Figure 37:
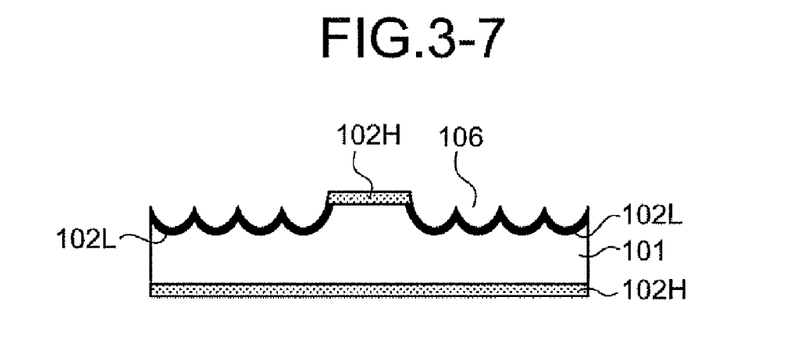

After the etching resistance film 103 is removed by using hydrofluoric acid or the like (FIG. 3-6), the silicon substrate 101 is input to the thermal oxidation furnace again, and is heated in the presence of phosphorous oxychloride (POCl$_3$) vapor. Thus, formed is the low-concentration N-type diffusion layer 102L having phosphorus diffused in a low concentration on the surface of the recesses 106 (FIG. 3-7). The diffusion temperature in this case is set at 840° C. Because the electrode forming region 105$b$ is a portion in which the high-concentration N-type diffusion layer 102H is not remained at an etching time, the resistance remains low even when diffusion in a low concentration is performed again on this portion. On an internal surface of the recesses 106 in the recess forming region 105$a$, which is in a state that the high-concentration N-type diffusion layer 102H is removed at the etching time, the low-concentration N-type diffusion layer 102L is formed by the diffusion process.

In this case, the surface sheet resistance of the high-concentration N-type diffusion layer 102H is preferably lower than 50Ω/□, and the surface sheet resistance of the low-concentration N-type diffusion layer 102L is preferably equal to or higher than 50Ω/□ and lower than 100Ω/□. This is because when the surface sheet resistance of the high-concentration N-type diffusion layer 102H is equal to or higher than 50Ω/□, a proportion that optical currents collected from the recesses 106 are converted into Joule heat becomes large and the efficiency of extracting the optical currents decreases. When the surface sheet resistance of the low-concentration N-type diffusion layer 102L is lower than 50Ω/□, the efficiency of converting incident light into electricity decreases. When the surface sheet resistance of the low-concentration N-type diffusion layer 102L is equal to or higher than 100Ω/□, optical currents generated in the recesses 106 are lost as Joule heat before the optical currents reach a light-incident-side electrode such as the grid electrode.

Figure 38:
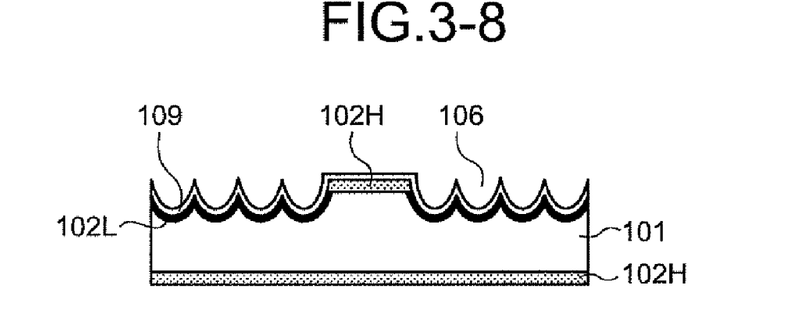

A phosphorus glass layer formed by heating in the presence of phosphorous oxychloride (POCl$_3$) vapor is removed in a hydrofluoric acid solution. Thereafter, the reflection prevention film 109 made of an SiN film or the like is formed on a cell surface by using a plasma CVD method (FIG. 3-8). The film thickness and refractive index of the reflection prevention film 109 are set at values at which light reflection is most suppressed. A film in two or more layers having different refractive indexes can be stacked. The reflection prevention film 109 can be formed by using a different film formation method such as a sputtering method.

Figure 39:
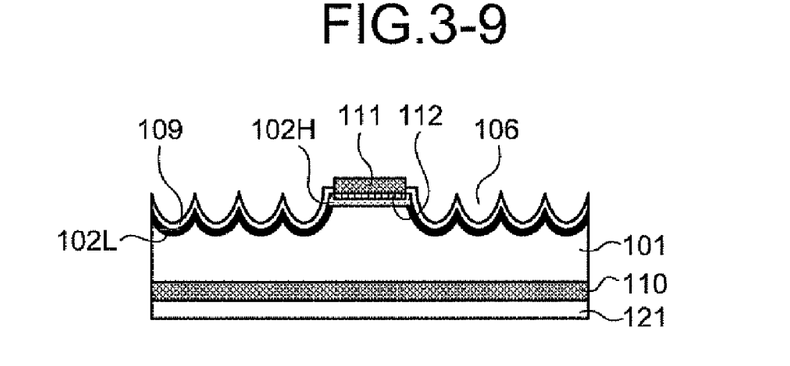

Thereafter, surface electrodes (the grid electrodes 111, the bus electrodes 113) and back surface electrodes (the backside electrodes 121, the backside collecting electrodes 122) are formed on a front surface and a back surface of the silicon substrate 101 (FIG. 3-9). In this case, first, a paste mixed with aluminum is formed on the entire surface by using screen printing for the backside electrodes 121. Next, a paste mixed with silver is formed by using screen printing in a comb shape for the grid electrodes 111 (the bus electrodes 113). A sintering process is then performed. The paste that becomes a basis of the grid electrodes 111 is formed on the electrode forming region 105$b$. The sintering process is performed at 760° C. in atmosphere. In this case, the grid electrodes 111 are in contact with the high-concentration N-type diffusion layer 102H by piercing through the reflection prevention film 109 at the junction portion 112. Consequently, the high-concentration N-type diffusion layer 102H can obtain a satisfactory resistant junction with upper electrodes (the grid electrodes 111, the bus electrodes 113). Aluminum in the backside electrodes 121 is diffused to the silicon substrate 101 by sintering, and the P+ layer 110 is formed within a predetermined range from the back surface of the silicon substrate 101. The photovoltaic device 100 is manufactured as described above.

According to the first embodiment, a low-resistance diffusion layer is formed on a substrate surface first, an etching resistance film is then formed. The fine pores 104 to form a texture structure are formed in a region other than the electrode forming region 105b at the light incident side. The recesses 106 are formed around a forming zone of the fine pores 104 by mixed acid etching. Thereafter, a high-resistance diffusion layer is formed on the substrate surface on which the recesses 106 are formed. Therefore, by adding only one process of forming the diffusion layer to a process of forming the texture structure, the low-resistance diffusion layer can be formed on the texture structure. As a result, there is an effect that a photovoltaic device can be obtained in a simple process at low cost. Particularly, when a laser beam is used to form the fine pores 104 to form the texture structure, a photolithography process can be also omitted. That is, because a process of forming a high-concentration-diffusion exclusive mask and patterning is not additionally necessary, a simpler manufacturing method of a photovoltaic device at low cost can be achieved.

In the electrode forming region 105b, a satisfactory resistance junction can be obtained, and an output characteristic of the photovoltaic device improves. As a result, there is an effect that a photovoltaic device of a high efficiency can be obtained in a simple process. A photovoltaic layer manufactured in this way can acquire a higher conversion efficiency than a conventional photovoltaic layer. Therefore, energy saving can be achieved.

Second Embodiment

It has been explained in the first embodiment that after the low-concentration N-type diffusion layer 102L is formed in the recesses 106 as shown in FIG. 3-7, a phosphorus glass layer on the high-concentration N-type diffusion layer 102H and the low-concentration N-type diffusion layer 102L is removed by a hydrofluoric acid solution. Alternatively, uppermost surfaces of the high-concentration N-type diffusion layer 102H and the low-concentration N-type diffusion layer 102L can be etched by a mixed liquid of hydrofluoric acid and nitric acid. Other procedures of a second embodiment are identical to those of the first embodiment, and thus explanations thereof will be omitted.

According to the second embodiment, after a phosphorus glass layer on the high-concentration N-type diffusion layer 102H and the low-concentration N-type diffusion layer 102L is etched, uppermost surfaces of the diffusion layers 102H and 102L are etched by a mixed acid such as a mixed liquid of hydrofluoric acid and nitric acid. Therefore, a carrier recombination rate in the N-type diffusion layers can be suppressed.

Third Embodiment

Figure 5:
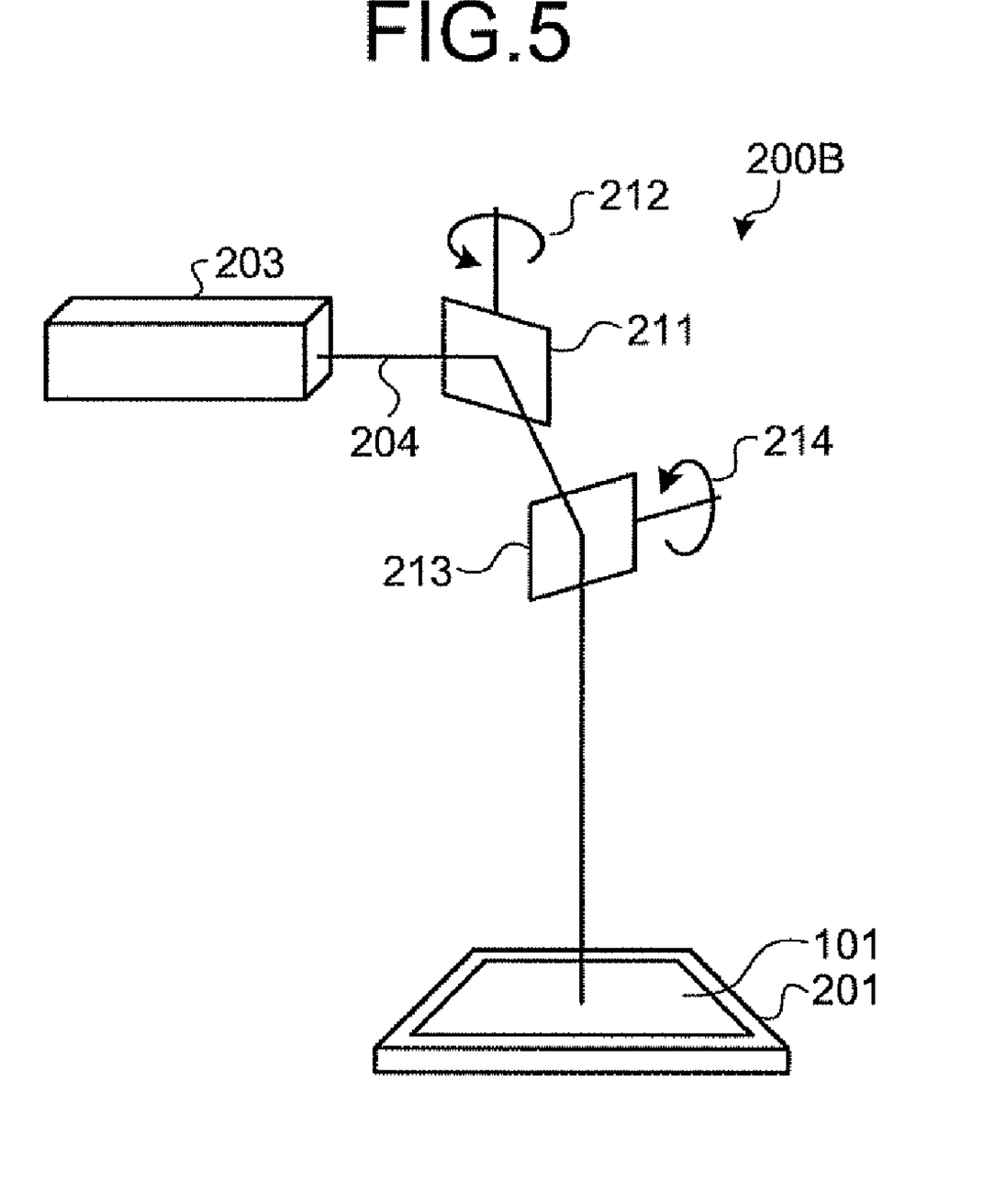
FIG. 5 depicts an exemplar configuration of a laser processing apparatus used to form openings in a third embodiment.

A case of forming openings by a method different from that of the first embodiment is explained in a third embodiment. FIG. 5 depicts an exemplar configuration of a laser processing apparatus used to form openings in the third embodiment. A laser processing apparatus 200B includes the stage 201 on which a processing target object such as the silicon substrate 101 is mounted, the laser oscillator 203 that outputs the laser beam 204, a first galvanomirror 211 that is arranged between the stage 201 and the laser oscillator 203 and guides the laser beam 204 in an optical path while scanning in an X-axis direction 212, and a second galvanomirror 213 that guides the laser beam 204 reflected by the first galvanomirror 211 in an optical path while scanning in a Y-axis direction 214.

In the laser processing apparatus 200B having this configuration, by scanning with the first and second galvanomirrors 211 and 213, the laser beam 204 collected in a spot shape is irradiated to a predetermined position of the etching resistance film 103 on the silicon substrate 101 in order to form the fine pores 104. In this way, by scanning the laser beam 204 in the X-axis direction 212 by rotating the first galvanomirror 211, and by scanning the laser beam 204 in the Y-axis direction 213 by rotating the second galvanomirror 213, the fine pores 104 can be formed at a high speed in the entire region of the silicon substrate 101. Specifically, in a case of forming 10,000 fine pores 104 per one scanning line at 15 micrometer pitch by using a laser beam of a repetition frequency 500 kilohertz, it suffices that the scanning frequency of the first galvanomirror 211 in the X-axis direction 212 is set at 50 hertz. Meanwhile, to form openings in close-packed arrangement on a triangular lattice, an interval of scanning lines in the Y-axis direction 214 needs to be set at 13 micrometers, and therefore the scanning speed in the Y-axis direction 214 on a surface of the silicon substrate 101 is set at 0.65 mm/second. With this arrangement, the fine pores 104 of a diameter 5 micrometers can be opened in close-packed arrangement of 15 micrometer pitch on the etching resistance film 103.

According to the third embodiment, the laser beam 204 can be irradiated by scanning the surface on the etching resistance film 103 as a processing target object by using the first and second galvanomirrors 211 and 213. Therefore, the fine pores 104 can be provided at a high speed even when multipoint irradiation is not performed.

Although a case of using the P-type silicon substrate 101 as the silicon substrate 101 has been explained in the first to third embodiments, identical effects can be also achieved in the photovoltaic device 100 of an opposite conductivity type that forms a P-type diffusion layer by using the N-type silicon substrate 101. Further, although polycrystalline silicon has been used for a substrate, identical effects can be also achieved by using a monocrystalline silicon substrate. Furthermore, although the substrate thickness is set at 250 micrometers in this case, a substrate of which thickness is reduced to a self-holdable level, such as about 50 micrometers, can be also used. Although dimensions have been described as 150 mm×150 mm, it is only an example, and identical effects can be also obtained when the dimensions are larger or smaller than the example. Furthermore, while a silicon substrate has been explained as an example of the substrate, the present invention is not limited thereto, and the first to third embodiments described above can be applied to semiconductor substrates in general.

INDUSTRIAL APPLICABILITY

As described above, the photovoltaic device according to the present invention is useful for solar cells that utilize solar light to generate electricity.

The invention claimed is:
1. A manufacturing method of a photovoltaic device, comprising:
a first diffusion-layer forming step of forming a first diffusion layer of a first concentration by diffusing a second conductivity-type impurity on an entire surface at a light-incident surface side of a first conductivity-type semiconductor substrate;

an etching-resistance-film forming step of forming an etching resistance film that has an etching resistance characteristic on the first diffusion layer;

a fine-pore forming step of forming fine pores by using a laser beam of a wavelength absorbed by the etching resistance film, at a predetermined position in a recess forming region on the etching resistance film to expose the first diffusion layer;

a recess forming step of forming recesses by etching the first diffusion layer and the semiconductor substrate by using an etching liquid around an exposed position of the first diffusion layer, so as not to leave the first diffusion layer within the recess forming region;

a etching-resistance-film removing step of removing the etching resistance film;

a second diffusion-layer forming step of forming a second diffusion layer by diffusing a second conductivity-type impurity in a second concentration, which is lower than the first concentration, on a surface on which the recesses are formed; and a surface-electrode forming step of forming a surface electrode in an electrode forming region other than the recess forming region at the light-incident surface side of the semiconductor substrate.

2. The manufacturing method of a photovoltaic device according to claim 1, wherein at the etching-resistance-film forming step, an SiN film is formed as the etching resistance film, and at the fine-pore forming step, a laser beam having a wavelength equal to or smaller than 700 nanometers is used.

3. The manufacturing method of a photovoltaic device according to claim 2, wherein a wavelength of the laser beam is equal to or smaller than 400 nanometers.

4. The manufacturing method of a photovoltaic device according to claim 1, wherein at the fine-pore forming step, a plurality of the fine pores are opened simultaneously on the etching resistance film by shielding a part of the laser beam by a mask.

5. The manufacturing method of a photovoltaic device according to claim 1, wherein at the fine-pore forming step, a plurality of the fine pores are opened by scanning the laser beam on the etching resistance film by using a galvanomirror.

6. The manufacturing method of a photovoltaic device according to claim 1, wherein at the fine-pore forming step, each of the fine pores is formed on a triangular lattice point or a square lattice point of the etching resistance film.

7. The manufacturing method of a photovoltaic device according to claim 1, wherein at the first diffusion-layer forming step, an uppermost surface of the first diffusion layer is removed after forming the first diffusion layer.

8. The manufacturing method of a photovoltaic device according to claim 1, wherein at the second diffusion-layer forming step, an uppermost surface of the second diffusion layer is removed after forming the second diffusion layer.

* * * * *